(12) United States Patent
Li Puma et al.

(10) Patent No.: US 9,847,800 B1
(45) Date of Patent: Dec. 19, 2017

(54) DIRECT COMPENSATION OF IQ SAMPLES FOR UNDESIRED FREQUENCY DEVIATION IN PHASE LOCKED LOOPS

(71) Applicant: Intel IP Corporation, Santa Clara, CA (US)

(72) Inventors: Giuseppe Li Puma, Bochum (DE); Victor Da Fonte Dias, Neubiberg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/164,056

(22) Filed: May 25, 2016

(51) Int. Cl.
*H04B 1/04* (2006.01)

(52) U.S. Cl.
CPC ... *H04B 1/0475* (2013.01); *H04B 2001/0491* (2013.01)

(58) Field of Classification Search
CPC .................. H04B 1/0475; H04B 1/525; H04B 2001/0416; H03F 1/3247; H03F 1/32; H03F 1/3294; H03F 1/3241; H03G 3/3042; H03G 3/3047
USPC .............................. 455/114.2, 115.1, 118, 126
See application file for complete search history.

(56) References Cited

U.S. PATENT DOCUMENTS

| 4,015,083 | A | * | 3/1977 | Bellisio | ............ | H04L 7/033 |
| | | | | | | 370/516 |
| 7,123,892 | B2 | * | 10/2006 | Li | ............ | H04B 1/001 |
| | | | | | | 375/324 |
| 8,249,207 | B1 | * | 8/2012 | Hissen | ............ | H03L 7/0807 |
| | | | | | | 375/355 |
| 9,257,999 | B1 | * | 2/2016 | Vilhonen | | |

OTHER PUBLICATIONS

Li Puma, G. et al. "Mitigation of Oscillator Pulling in SoCs." IEEE Journal of Solid-State Circuits, vol. 51, No. 2, Feb. 2016, pp. 348-356.
Li Puma, G. et al. "Adaptive Techniques to Mitigate Oscillator Pulling in Radio Transmitters." DOI 101.1109/TCSII.2016. 2552143. IEEE Transactions on Circuits and Systems II: Express Briefs. pp. 1-5.
U.S. Appl. No. 15/449,078, filed Mar. 3, 2016.

* cited by examiner

*Primary Examiner* — Nhan Le
(74) *Attorney, Agent, or Firm* — Eschweiler & Potashnik, LLC

(57) ABSTRACT

A transmitter includes estimation circuitry and correction circuitry. The estimation circuitry is configured to estimate, based at least on a phase error between a local oscillator and a reference frequency, values for parameters that describe a frequency deviation experienced by a phase locked loop (PLL) during transmission of the data sample, wherein the PLL includes a local oscillator. The correction circuitry is configured to generate a correction term based at least on the estimated parameters; adjust the data sample with the correction term to generate a compensated data sample; and provide the compensated data sample for modulation of a carrier wave generated by the local oscillator.

14 Claims, 5 Drawing Sheets

US 9,847,800 B1

DIRECT COMPENSATION OF IQ SAMPLES FOR UNDESIRED FREQUENCY DEVIATION IN PHASE LOCKED LOOPS

FIELD

The present disclosure relates to the field of radio frequency (RF) transmitters and in particular to methods and apparatus for compensating of undesired frequency deviation effects in phase locked loops (PLLs).

BACKGROUND

PLLs are subject to undesired frequency deviation effects due to many causes. For example, Cartesian and polar RF transmitters are subject to a local oscillator pulling effect which causes distortion of the transmitted signal. Local oscillator pulling is essentially re-modulation of the local oscillator frequency that is for example caused by radiated or conducted interference induced by the varying amplitude of the strong signal output by the transmitter or the power amplifier. Oscillator pulling is not only restricted to pulling induced by the transmit signal, but it can be caused by arbitrary aggressors. For instance, due to the crosstalk through digital switching circuits the oscillator can experience pulling generating undesired spurious sidebands.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
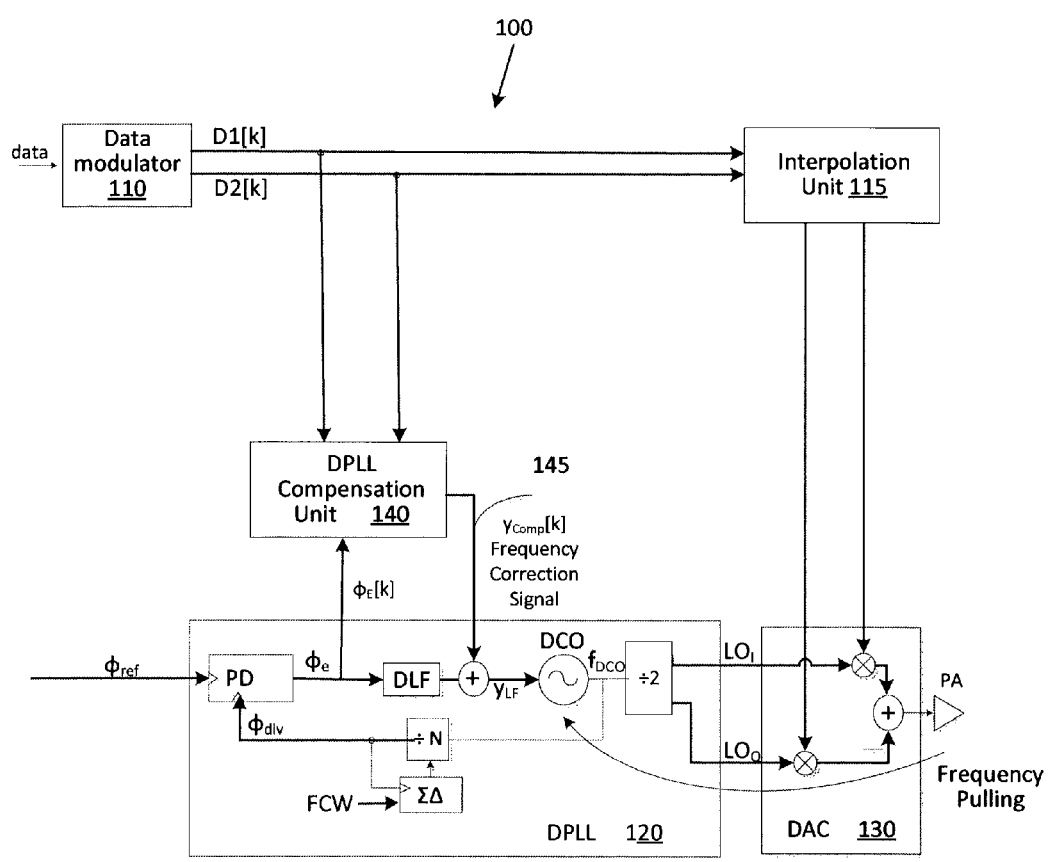
FIG. 1 illustrates an example transmitter architecture in which an input signal to a local oscillator is adjusted to compensate for the pulling effect.

FIG. 1 illustrates a transmitter architecture 100 in which data is modulated onto an RF carrier wave for transmission by an antenna (not shown). The transmitter architecture 100 includes a data modulator 110, interpolation unit 115, a digital phase locked loop (DPLL) 120 and a digital to analog convertor (DAC) or mixer 130. The data input to the data modulator 110 may be a series of ones and zeros that encode a voice signal or other information to be communicated by the transmitted signal. The data is converted to a sufficiently high rate by means of sample rate conversion or interpolation and applied to the DAC input.

The data modulator 110 converts the data into two data samples D1, D2. The data modulator 110 may convert the data into a series of symbols, where each symbol is represented by the data samples D1[k], D2[k]. For example, the data samples D1, D2 may correspond to coordinates on the complex plane (e.g., a constellation diagram) for the symbol. In a Cartesian transmitter, the data samples D1, D2 are I and Q values for a position on the complex plane, where the I value is the distance from the origin along the real axis and the Q value is the distance from the origin along the imaginary axis. In a polar transmitter, the data samples D1, D2 are an amplitude value (denoted herein as "A") and an angle value (denoted herein as "θ") for a position on the complex plane. The A value is the distance from the origin and θ is the angular displacement.

The DPLL 120 generates a carrier wave that will be modulated by the data samples D1, D2 to create the transmitted RF signal. The carrier wave is an RF wave having some selected carrier frequency. It is important that the transmitted RF signal consistently have the selected carrier frequency, as deviations in the frequency will distort the transmitted RF signal, making it difficult for the receiver of the signal to recover the data carried by the signal. The DPLL 120 includes an adjustable oscillator with a gain $K_{DCO}$ defined as a code-to-frequency conversion gain that receives an input control signal and outputs a wave having a frequency $f_{DCO}$. In this embodiment, the frequency is chosen as twice the selected carrier frequency to ease generation of the quadrature LO signals $LO_I$ and $LO_Q$. Thus, the wave output by the oscillator is divided by 2 to create the carrier wave output by the DPLL 120. But due coupling of the second harmonic of the transmit signal, the pulling problem is present. In other applications, the DCO could operate at four times the transmit frequency. In this case, the oscillator would be prone to injection pulling by the fourth harmonic of the transmit signal.

The feedback loop of the DPLL 120 includes a divider element "÷N", a phase detector PD, and a digital loop filter DLF. The divider element divides the frequency of the wave output by the oscillator by the number N. The number N can be changed to select the frequency of the carrier wave that will be output by the DPLL 120. The phase detector PD compares the phase of the frequency $f_{DCO}/N$ ("$\phi_{DIV}$") to a reference phase $\phi_{ref}$ and outputs the phase difference as a phase error $-\phi_E$ ($-\phi_E$ will be called "the phase error of the DPLL" or "the phase error between the local oscillator and a reference frequency" herein). The output of the phase detector PD is smoothed by the loop filter DLF and input to the oscillator which generates $f_{DCO}=f_O+K_{DCO}d_{in}$ where $f_0$ is the free-running oscillator frequency, $K_{DCO}$ is the DCO gain and $d_{in}$ is the input word. In essence, the oscillator's frequency is adjusted through a frequency command word (FCW) to generate the desired frequency at the output of the DPLL 120.

The DAC 130 generates the transmit signal by up-converting the data samples D1, D2 with the quadrature LO signals generated by the DPLL. From the functional point of view the DAC 130 includes two mixers that each adjust the amplitude of an instance of the carrier wave based on one of the data samples, D1 or D2, to create a carrier signal component. The DAC 130 also includes an adder that incorporates the two carrier signal components to produce the RF signal that is transmitted.

As described above, due to the pulling effect, the signal transmitted by the transmitter will affect the frequency of the local oscillator depending on the strength (e.g., amplitude) of the signal being transmitted. To counteract the pulling effect, the transmitter architecture 100 includes a DPLL compensation unit 140 that generates a frequency compensation signal $y_{comp}[k]$ that is added to the smoothed phase error from the phase detector PD and input to the local oscillator to adjust the frequency of the local oscillator. The frequency compensation signal is a function of the amplitude and the phase of the transmit signal.

It can be seen in FIG. 1 that the frequency compensation signal is added at the input of the local oscillator. The frequency compensation signal is expected to counteract the interference captured by the oscillator, either through radiated (between coils or signal lines), capacitive, or conducted (supply, ground, etc.) interference. Because the frequency compensation signal is added to the DCO in a direct manner, the compensation path 145 on which the frequency compensation signal is clocked has a relatively high frequency, resulting in increased implementation complexity and higher power consumption. Typically, the frequency modulation accuracy requires high-speed dithering of a few varactor elements. Also, the local oscillator utilizes a fine tuning array, which demands analog precision circuitry, in order to incorporate the fine adjustments made by the frequency compensation signal, resulting in high complexity and time consuming design effort.

The present disclosure concerns methods and apparatus for compensating for the pulling effect by directly correcting the data being transmitted instead of correcting at the input of the local oscillator within the phase locked loop. In this manner, fine adjustments are not being made to the local oscillator and instead the phase locked loop may be left to drift around under the effect of the interfering signal. This eliminates the need for a fine tuning array for the local oscillator, simplifying the design significantly. By correcting the data instead of the adding a correction signal into the phase locked loop, the compensation takes place inside the baseband processing facilities, eliminating the compensation path 145 in the PLL.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be incorporated with each other, unless specifically noted otherwise.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 2:
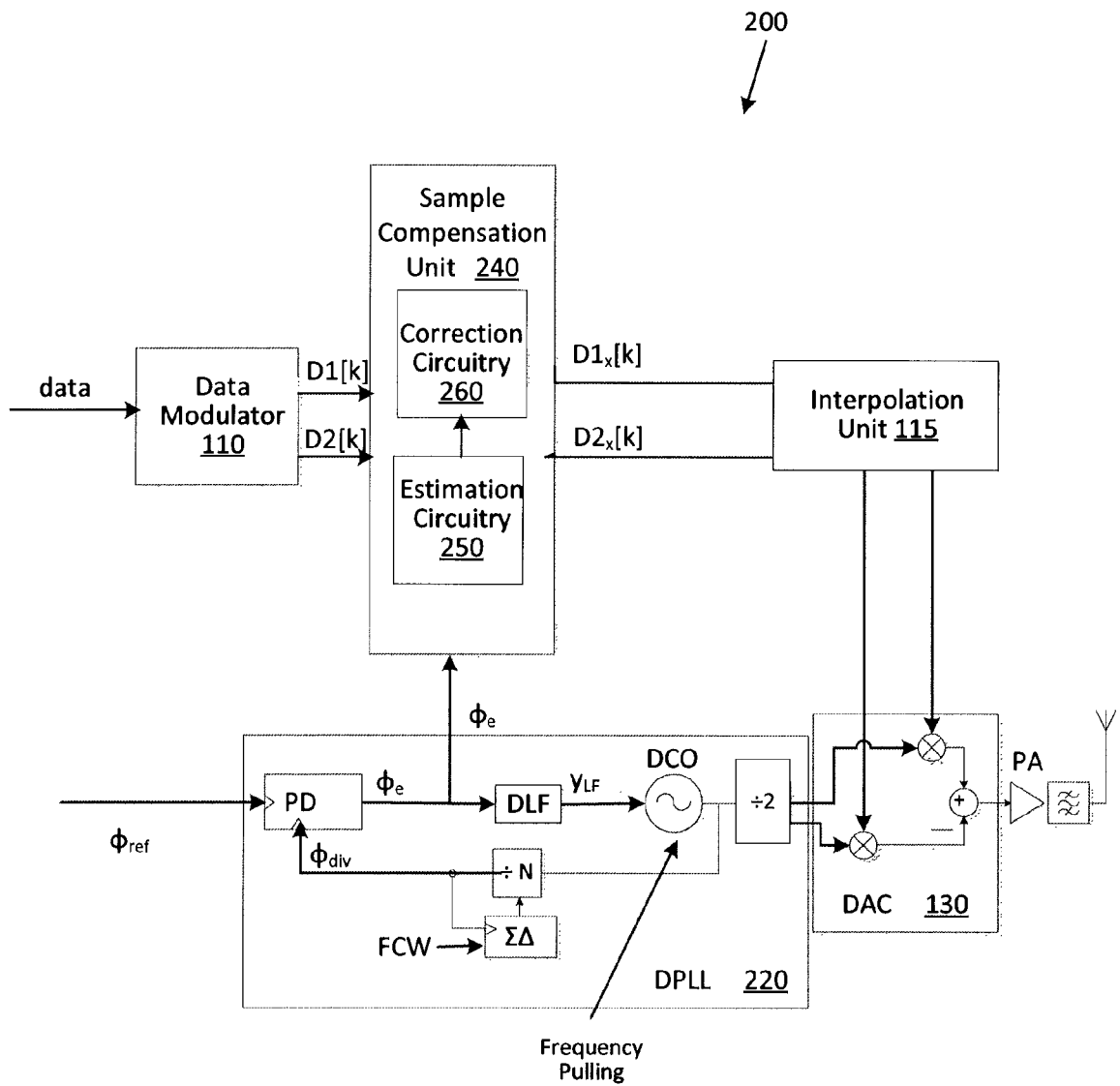
FIG. 2 illustrates an example transmitter architecture in which a carrier wave generated by a local oscillator is modulated by data samples that have been adjusted to compensate for the pulling effect on the local oscillator, according to one embodiment of the disclosure.

FIG. 2 illustrates a block diagram of a transmitter architecture 200 that directly corrects data samples to compensate for the pulling effect on a local oscillator. The architecture 200 includes the data modulator 110, the interpolator 115, and the DAC 130 of FIG. 1 as well a DPLL 220. The DPLL 220 functions in the same way to that described with respect to the DPLL 120 of FIG. 1 except that the compensation path 145 is not present. The compensation path 145 was used in the architecture of FIG. 1. to compensate for the experienced pulling. Note that in a Cartesian modulator the local oscillator, which can be either a VCO or DCO, does not need fine tuning capabilities for modulation. Fine-tuning is only used to set the oscillator frequency on the desired channel frequency accurately and for tracking small frequency changes due to temperature and voltage drifts. However, the local oscillator DCO or VCO of the DPLL 120 in FIG. 1 also relies on fine-tuning capabilities to correct for the frequency deviation due to the pulling effect. In FIG. 2 the compensation of the pulling will be performed on the IQ data samples without requiring the compensation path 145, as will be described in more detail.

The architecture 200 includes a data sample compensation unit 240 that is configured to directly adjust the data samples D1[k], D2[k] to compensate for the pulling effect on the local oscillator's frequency. The data sample compensation unit 240 inputs the data samples D1[k], D2[k] and outputs compensated data samples $D1_x[k]$, $D2_x[k]$. The compensated data samples $D1_x[k]$, $D2_x[k]$ are used to modulate the carrier wave generated by the DPLL 220. The frequency of the carrier wave will be affected by the transmission of the data samples (through the undesired pulling effect), however, the compensated data samples $D1_x[k]$, $D2_x[k]$ have been adjusted to account for this undesired frequency deviation, meaning that the resulting RF signal will properly represent the original data samples D1[k], D2[k].

The data sample compensation unit 240 includes estimation circuitry 250 and correction circuitry 260. The estimation circuitry 250 and correction circuitry 260 may be implemented using a baseband processor, firmware, hardware components or other suitable electronic elements. The estimation circuitry 250 is configured to estimate, based at least on the i) phase error of the DPLL, which is between the local oscillator and a reference frequency and ii) an amplitude and phase of the data sample, parameters describing an undesired frequency deviation of a local oscillator that will occur during transmission of the data sample, such as the frequency pulling effect induced by transmission of the data sample. An exemplary embodiment of the estimation circuitry 350 can be found in G. Li Puma and C. Carbonne, "Mitigation of Oscillator Pulling in SoCs,", IEEE J. Solid-State Circuits, vol. 51, no. 2, pp. 348-356, February 2016 and in G. Li Puma; R. Avivi; C. Carbonne, "Adaptive Techniques to Mitigate Oscillator Pulling in Radio Transmitters," in IEEE Transactions on Circuits and Systems II: Express Briefs, vol. PP, no. 99.

The correction circuitry 260 is configured to i) generate a correction term based at least on the estimated parameters; ii) adjust the data sample with the correction term to generate a compensated data sample; and iii) provide the compensated data sample to the interpolation unit 115 and subsequently to the DAC 130 for modulation of the carrier wave generated by the local oscillator. It can be seen in FIG. 2 that there is no compensation path to the DPLL 220, no adjustments are made to the DPLL by the data compensation unit 240, and that the compensation effort takes place in the signal path.

Figure 3A:
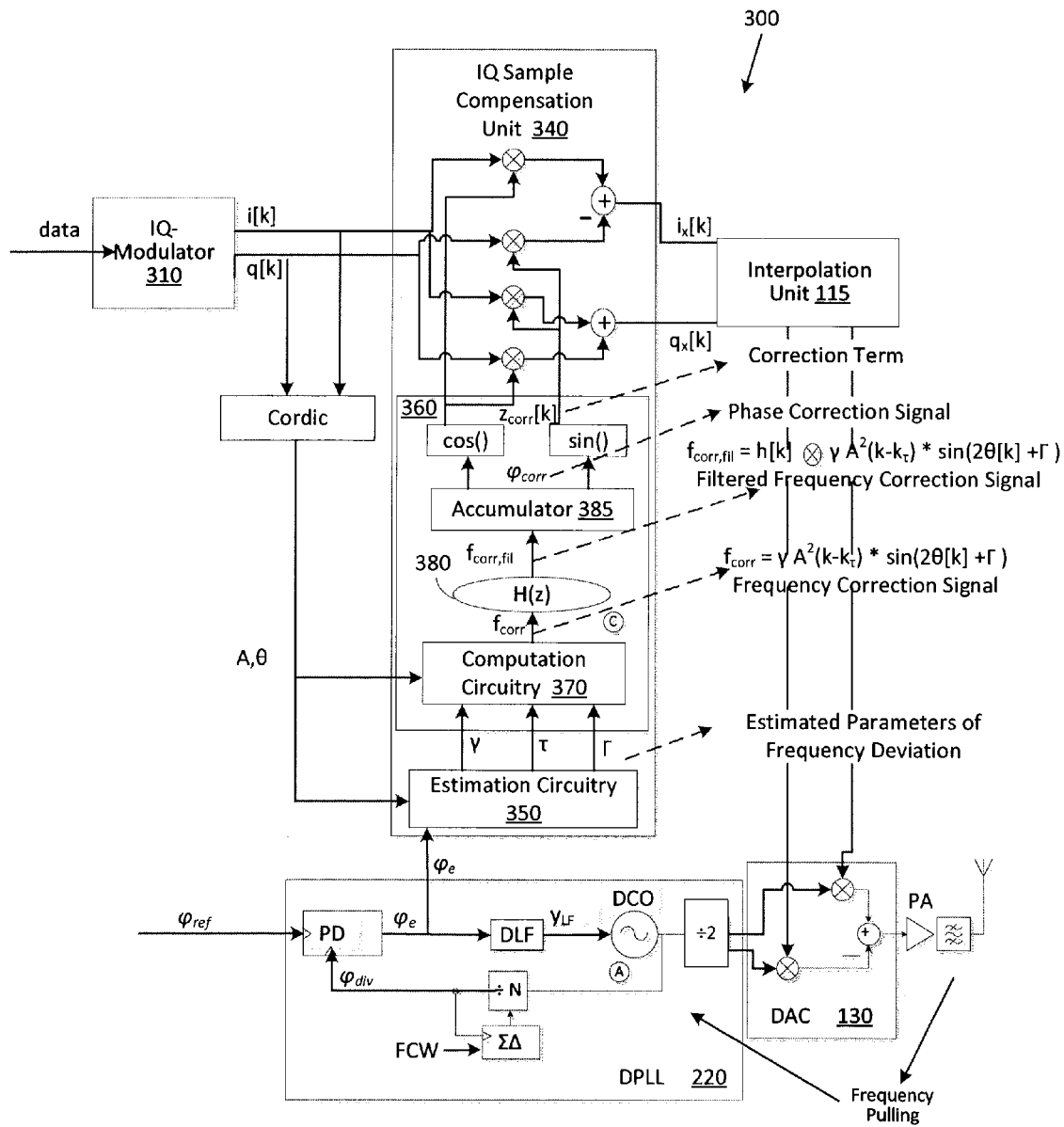
FIGS. 3A and 3B illustrate an example Cartesian transmitter architecture in which a carrier wave generated by a local oscillator is modulated by IQ data samples that have been adjusted to compensate for a pulling effect on the local oscillator, according to one embodiment of the disclosure.

FIG. 3A illustrates a block diagram of a Cartesian transmitter architecture 300 that includes an IQ data sample compensation unit 340 configured to directly adjust Cartesian data samples to compensate for the pulling effect on the local oscillator frequency. The architecture 300 includes an IQ modulator 310 that samples the data to be transmitted and outputs Cartesian component values i[k], q[k] (referred to herein as the "Cartesian data sample" for simplicity) that describe a position on the complex plane (e.g., a symbol). The architecture 300 also includes the interpolator 115 of FIG. 1, the DPLL 220 of FIG. 2, and the DAC 130 of FIG. 1 that modulates the carrier wave output by the DPLL 220.

The IQ data sample compensation unit 340 is a particular implementation of the data sample compensation unit 240 of FIG. 2 that inputs the Cartesian data sample and outputs a compensated Cartesian data sample $i_x[k]$, $q_x[k]$. The compensated Cartesian data sample describes a different position on the complex plane than the original Cartesian data sample i[k], q[k]. The output of the IQ sample compensation unit 340 is used by the interpolation unit 115 and the DAC 130 to modulate the carrier wave output by the DPLL 220.

The architecture of the IQ sample compensation unit 340 is derived as follows. An IQ modulated signal that is subject to pulling can be expressed as:

$$s(t)Re\{(i+jq)e^{j\omega_{tx}t+j\phi_{pull}}\} \qquad \text{Eq. (1)}$$

Where i and q are the in-phase and quadrature signals respectively, $\omega_{tx}$ is the angular carrier frequency and $\phi_{pull}$ is the undesired phase shift due to the pulling effect.

In the absence of pulling, i.e. $\phi_{pull}=0$, expression (1) yields the desired ideal carrier signal:

$$s(t)=Re\{(i+jq)e^{j\omega_{tx}t}\} \qquad \text{Eq. (2)}$$

In order to correct the pulling effect, Equation 1 can be rewritten as:

$$s(t)=Re\{z_x e^{j\omega_{tx}t+j\phi_{pull}}\} \qquad \text{Eq. (3)}$$

where the desired compensated Cartesian data sample is $z_x=z_{iq} Z_{corr}=i_x+jq_x$. The term $z_{iq}$ denotes the complex IQ data given by $z_{iq}=i+jq$. Hence the carrier can be further rewritten as:

$$s(t)=Re\{z_{iq} \cdot z_{corr} \cdot e^{j\omega_{tx}t}e^{j\phi_{pull}}\}=Re\{z_{iq} \cdot e^{j\phi_{corr}} \cdot e^{j\omega_{tx}t}e^{j\phi_{pull}}\} \qquad \text{Eq. (4)}$$

The compensation for the pulling effect can be achieved by setting $\phi_{corr}=-\phi_{pull}$, which will recover the desired signal as given in Equation 2.

The DCO is enclosed in a DPLL, meaning that the experienced pulling is subject to the DPLL control loop response. Thus within the DPLL bandwidth the deviation of the oscillator phase will be perceived as an error and the PLL control loop response will correct for the perceived error. In acknowledgement of this fact, Eq. (1) can be rewritten as:

$$s(t)=Re\{(i+jq)e^{j\omega_{tx}t+j\phi_{pull}\hat{x}h(t)}\} \qquad \text{Eq. (5)}$$

where the impulse response h(t) acknowledges the transfer function of DPLL control loop which stems from the fact that the DCO is subject to the DPLL filtering response.

In the absence of pulling the expression yields the desired carrier signal $$s(t)=Re\{(i+jq)e^{j\omega_{tx}t}\} \qquad \text{Eq. (6)}$$

In order to correct the pulling effect, Equation 5 can be rewritten as:

$$s(t)=Re\{z_x e^{j\omega_{tx}t+j\phi_{pull}\hat{x}h(t)}\} \qquad \text{Eq. (7)}$$

where the desired compensated Cartesian data sample is $z_x=z_{iq} z_{corr}=i_x+jq_x$. Hence the carrier can be further rewritten as:

$$s(t)=Re\{z_{iq} \cdot z_{corr} \cdot e^{j\omega_{tx}t+j\phi_{pull}\hat{x}h(t)}\}= Re\{z_{iq} \cdot e^{j\phi_{corr}} \cdot e^{j\omega_{tx}t}e^{j\phi_{pull}\hat{x}h(t)}\} \qquad \text{Eq. (8)}$$

The compensation for the pulling effect can be achieved by setting a phase correction signal $\phi_{corr}=-\phi_{pull}\hat{x}h(t)$. This will recover the desired signal given in Equation 6.

The hardware architecture of the IQ data sample compensation unit 340 shown in FIG. 3. is the result of the derivation above. The frequency of an oscillator that is experiencing a pulling effect can be written as:

$$f_{DCO} = f_O - \frac{v_{inj}}{v_{osc}} \frac{f_O}{2Q} \sin(\alpha) \qquad \text{Eq. (9)}$$

in which $f_O$ is the free-running oscillator frequency and the latter term describes the pulling frequency experienced by the oscillator. $V_{osc}$ denotes the oscillator amplitude, Q is the quality factor for the resonator tank. $V_{inj}(t)$ is the time-varying amplitude of the injection signal, and a(t) is the instantaneous angle between $v_{inj}(t)$ and $v_{osc}$.

The interference signal experienced by the oscillator due to interference caused by injection of the second harmonic of the transmit signal that is perceived by the oscillator can be expressed as:

$$f_{p1}(t) = \gamma A^2(t)\sin(2\theta(t)+\Gamma) \qquad \text{Eq. (10)}$$

The link between Eq. (9) and Eq. (10) has been derived in reference G. Li Puma and C. Carbonne, "Mitigation of Oscillator Pulling in SoCs,", IEEE J. Solid-State Circuits, vol. 51, no. 2, pp. 348-356, February 2016.

The frequency deviation experienced by the oscillator due to pulling caused by injection of the second harmonic of the transmit signal at the output of the DPLL can be expressed as:

$$f_{p2}(t) = h(t) \hat{\otimes} \gamma A^2(t)\sin(2\theta(t)+\Gamma) \qquad \text{Eq. (11)}$$

Where the operator $\hat{x}$ denotes the time convolution operator. A(t) is the magnitude and θ(t) is the modulating phase of the transmit signal. The parameters γ and Γ are the unknown gain and phase offset of the coupling effect. The impulse response, h(t) is the closed loop response of the DPLL control loop. This acknowledges the fact that the DCO is included in closed control loop. More specifically, the filter response h(t) is the closed loop response from the injection point of the DCO to the output of the DPLL. This function is known except for the precise gain and phase which are both estimated and included in the estimated values of γ and Γ done by the estimation unit 340. Typically this transfer function experiences a highpass or bandpass characteristic. This technique is not limited to compensation for pulling due by second order harmonic of the transmit signal. As will be discussed in FIG. 4, the technique can be extended to compensate for any arbitrary coupling, for instance through crosstalk by the baseband envelope signal A(t) or any other function.

Since the phase is the time integral of the frequency, the phase correction signal is obtained as $\phi_{corr}=2\pi\int f(t)dt$. In a discrete-time implementation the integral is replaced by a cumulative sum, i.e. $\phi_{corr}=2\pi T_S \Sigma_k f_{corr,fil}[k]$ which is realized in a practical application through an accumulator component 385. The IQ correction term is then generated by converting the phase correction signal $\phi_{corr}$ to Cartesian coordinates to be incorporated with the data coordinates:

$$z_{corr}=i_{corr}+jq_{corr}=\cos(\phi_{corr})+j\sin(\phi_{corr}) \qquad \text{Eq. (12)}$$

Thus, in one embodiment, the IQ data sample compensation unit 340 first estimates parameters describing a frequency deviation that will occur in a local oscillator due to pulling and applies a filter to the frequency correction signal to simulate the filtering aspect of the DPLL to generate a correction term, which has been appropriately filtered, to be applied to the data.

Recall that the frequency deviation that results from the pulling effect is a function of the parameters τ, Γ, and γ, which are estimated based on the phase error of the DPLL 220. The IQ data sample compensation unit 340 includes estimation circuitry 350 configured to estimate the parameters τ, Γ, and γ based on the phase error of the DPLL 220 and also on the amplitude A and phase θ of the data sample (i.e., the data sample expressed in polar notation as opposed to Cartesian notation). The amplitude A and phase θ may be computed by a CORDIC (Coordinate Rotation Digital Computer) that converts the Cartesian data sample components i[k] and j[k] to their polar equivalents A[k] and θ[k].

In one embodiment, the estimation circuitry 350 uses Least-Means-Squares or another minimization criterion to estimate the parameters τ, Γ, and γ in the second order harmonic interference equation based on observed values of the phase error of the DPLL and the values of A and θ that produced the phase error. The envelope delay may be estimated using cross correlation. The estimation circuitry 350 outputs the estimated values for the parameters to correction circuitry 360.

Figure 3B:
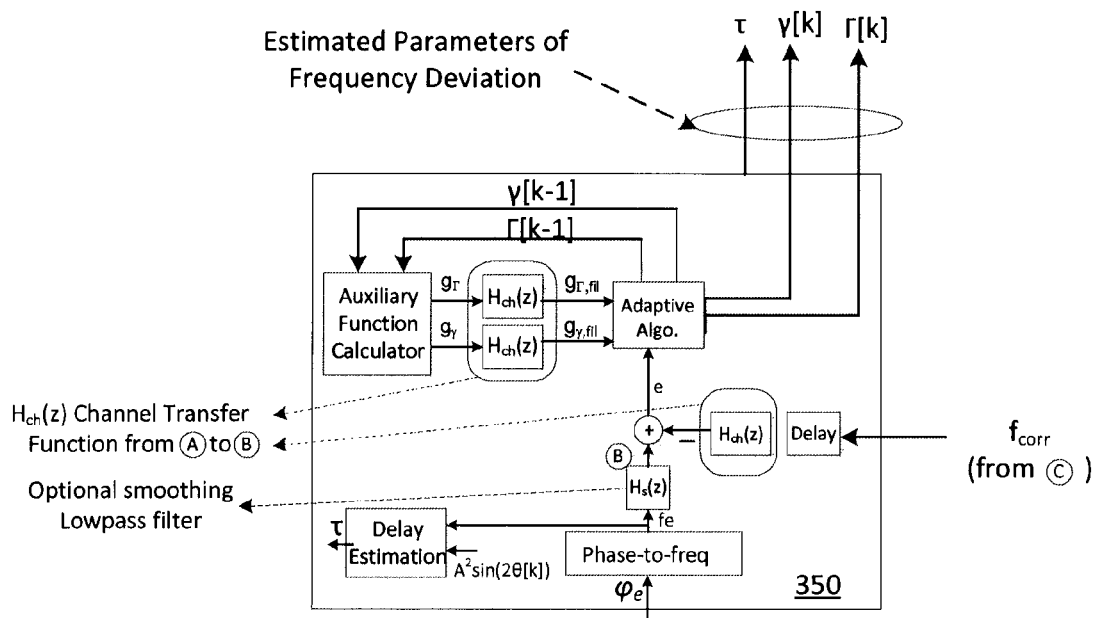

FIG. 3B illustrates an architecture of one example embodiment of the estimation circuitry 350. The derivation of the hardware of the architecture shown in FIG. 3B will be described. The same principles can be applied to pulling caused by arbitrary signals. To estimate the unknown parameters, the minimum-mean-square error (MMSE) criterion is adopted. The MMSE is defined as the squared difference between the pulling frequency $f_{p1}$ and the compensating frequency signal $f_{corr}$. The problem statement is expressed by the solving the cost function argmin J with respect to the unknown parameters γ, Γ and τ where J is defined as J[k]=e[k] where e[k] is defined as the error signal to be minimized.

This error signal can be obtained from the phase error $\phi_e$ at the PD output which is converted to a frequency error $f_e$ a the phase-to-frequency conversion block. The error signal can be expressed by the equation:

$$e = f_{e,0} + f_{p1} \hat{\otimes} h_{ch} - f_{corr} \hat{\otimes} h_{ch}. \qquad \text{Eq. (13)}$$

where the symbol $\hat{x}$ denotes the time convolution operator, $f_{e,0}$ is the frequency error due to noise in the absence of pulling, $f_{p1}\hat{\otimes}h_{ch}$ denotes the frequency error due to pulling and $f_{corr}\hat{\otimes}h_{ch}$ is the frequency correction signal. The impulse response $h_{ch}[k]$ denotes the "channel impulse response" undergone by the frequency pulling to the input of the adaptive algorithm block. It describes the transfer function from the injection point of the DCO (denoted as point A in FIG. 3A) to the output of the optional smoothing lowpass filter output $H_s[k]$ denoted as point B in FIG. 3B. In essence, it consists of the cascaded transfer function of the closed-loop transfer function from the DCO injection point A to the output of the phase-to-frequency conversion block and the smoothing filter $H_s[k]$. Typically, this transfer function exhibits a band-pass characteristic. The smoothing filter is an optional filter which might be inserted to attenuate the high frequency noise of the PLL perceived at the PD output and the quantization noise of the PD which is commonly realized as time-to-digital converter (TDC).

Hence, in one example, the cost function can be written as:

$$\operatorname*{argmin}_{\gamma,\Gamma,\tau} J = \operatorname*{argmin}_{\gamma,\Gamma,\tau} Ee[k]^2 = \operatorname*{argmin}_{\gamma,\Gamma,\tau} E(f_{e,0} + f_{p1} \otimes h_{ch} - f_{corr} \otimes h_{ch})^2 \qquad \text{Eq. (14)}$$

where "E" is the expectation operator. Since in most cases the statistical properties of the data are not known, instantaneous values are used as an approximation, dropping the expectation operator "E". It should be noted, that other cost functions can be used as well. In one other example, the cost function can be formulated based on the phase error signal $\phi_e$ from the PD output signal without engaging the phase-to-frequency conversion unit. In essence the error term can be formulated as:

$$e = \phi_{e,0} + \phi_{p1} \otimes h_{ch} - \int f_{corr} dt \otimes h_{ch}$$

Where $\phi_{e,0}$ is the phase error due to noise, the term $\phi_{p1} \hat{x} h_{ch}$ is the phase error due to pulling and $\int f_{corr} dt \hat{x} h_{ch}$ is the correction phase term which is time integral of the frequency correction term.

$$\operatorname*{argmin}_{\gamma,\Gamma,\tau} J = \operatorname*{argmin}_{\gamma,\Gamma,\tau} Ee[k]^2 = \operatorname*{argmin}_{\gamma,\Gamma,\tau} E\left(\varphi_{e,0} + \varphi_{p1} \otimes h_{ch} - \int f_{corr} dt \otimes h_{ch}\right)^2$$

It is assumed without loss of generality that the LO is running at twice the output frequency. Considering frequency pulling due to coupling of the second harmonic transmit signal, the cost function can be expressed as $$J = (f_{e,0} + f_{p1} \otimes h_{ch} - \gamma A[k]^2 \sin(2\theta[k]+\Gamma) \otimes h_{ch})^2 \quad \text{Eq. (15)}$$

The time-delay can be obtained from an initial estimation through correlation which is performed in the delay estimation unit as indicated in FIG. 3B. Hence, $\tau$ can be replaced by its estimate and the dependency on $\tau$ may be dropped from the cost function J. To obtain the remaining unknowns, $\gamma$, $\Gamma$ requires computation of the gradients with respect to $\gamma$ and $\Gamma$ which are written as:

$$\frac{dJ}{d\gamma} = \nabla J_\gamma = 2e[k] \left( \underbrace{\underbrace{A^2[k]\sin(2\theta+\Gamma) \otimes h_{ch}[k]}_{g_\gamma}}_{g_{\gamma,fil}} \right) \quad \text{Eq. (16)}$$

$$\frac{dJ}{d\Gamma} = \nabla J_\Gamma = 2e[k] \left( \underbrace{\underbrace{\gamma A^2[k]\cos(2\theta+\Gamma) \otimes h_{ch}[k]}_{g_\Gamma}}_{g_{\Gamma,fil}} \right) \quad \text{Eq. (17)}$$

The auxiliary function calculator in FIG. 3B computes the auxiliary signals $g_\gamma[k]$ and $g_\Gamma[k]$. These auxiliary signals are subsequently conditioned through the channel transfer function $H_{ch}[k]$ to obtain, $g_{\gamma,fil}[k]$ and $g_{\Gamma,fil}[k]$.

With knowledge of these gradients (slopes), the update recursion of the LMS for the parameters $\gamma$ and $\Gamma$ is written as:

$$\gamma[k] = \gamma[k-1] - \lambda_\gamma \nabla J_\gamma, \quad \Gamma[k] = \Gamma[k-1] - \lambda_\Gamma \nabla J_\Gamma \quad \text{Eq. (18)}$$

Where $\lambda_\gamma$ and $\lambda_\Gamma$ are variable step-sizes. These operations are finally performed in the adaptive Algorithm block shown in FIG. 3B.

At each clock cycle k, the coefficients of the previous estimate $\gamma[k-1]$ and phase $\Gamma[k-1]$ are fetched by the auxiliary function calculator unit to generate signals $g_\gamma[k]$ and $g_\Gamma[k]$. With knowledge of $g_{\gamma,fil}$ and $g_{\Gamma,fil}$ and the error signal e[k], the adaptive algorithm block computes new estimates $\gamma[k]$ and phase $\Gamma[k]$. Based on these estimates the correction unit generates the desired correction signal $$f_{corr}[k] = \gamma[k] \cdot A[k]^2 \sin(2\theta[k]+\Gamma[k]). \quad \text{Eq. (19)}$$

Returning now to FIG. 3A, the correction circuitry 360 includes a computation unit 370, a filter component 380, and an accumulator component 385. In one embodiment, the computation unit 370 computes a correction term $z_{corr}[k]$ based on the parameters $\tau$, $\Gamma$, and $\gamma$ that describe the frequency deviation signal received from the estimation circuitry 350.

In one embodiment, the computation unit 370 computes a second order harmonic frequency correction signal as a function of an amplitude and phase of the data sample and the estimated envelope delay, the estimated gain, and the estimated phase offset determined by the estimation circuitry. The frequency correction signal will be used herein as a shorthand for "frequency deviation correction signal," as the frequency correction signal is in fact generated to correct for the frequency deviation due to pulling. The equation for a second order harmonic frequency correction signal, $f_{corr}$, is shown at the output of the computation unit 370 in FIG. 3. Once correctly estimated, the frequency correction signal $f_{corr}$ matches the frequency interference signal caused by the injection signal $f_{p1}$ of equation 11.

$$f_{corr} = \gamma A^2 [k-k_\tau] * \sin(2\theta[k]+\Gamma) \quad \text{Eq. (20)}$$

The filter component 380 models the filter response of the PLL control loop in the DPLL 220 and is used to filter the frequency correction signal output by the computation unit 320 to generate a filtered frequency correction signal $f_{corr,fil}$. The filtering operation ensures that the frequency correction signal undergoes the same filtering as the injection signal that caused the pulling of the oscillator. As described above, the control loop response h(t) is the closed loop response from the injection point of the oscillator to the output of the DPLL. This function is known except for the gain and phase which are both estimated by the estimation unit 340 and included in $\gamma$ and $\Gamma$. Hence this transfer function can be expressed in the discrete-time domain by the filter H(z) in filter component 380.

The result of the filtering operation is shown in FIG. 3A at the output of the filter component 380 which represents the filtered frequency correction signal:

$$f_{corr,fil} = h[k] \otimes \gamma A^2(k-k_\tau) * \sin(2\theta[k]+\Gamma) \quad \text{Eq. (21)}$$

where $k_\tau$ is the discrete time estimate of $\tau$.

Since the phase is the time integral of the frequency, the phase correction signal is obtained as $\phi_{corr} = 2\Sigma \int f(t) dt$. In a discrete-time implementation the integral is replaced by a cumulative sum, i.e. $\phi_{corr} = 2\pi T_S \Sigma_k f_{corr,fil}[k]$ which is realized in a practical application through an accumulator component 385.

The phase correction signal is broken into Cartesian components by cosine and sine function blocks to generate the IQ data sample correction term $z_{corr}[k]$ which consists of $i_{corr}[k] = \cos(\phi_{corr})$ and $q_{corr}[k] = \sin(\phi_{corr})$. The IQ sample compensation unit 340 is configured to incorporate the data correction term $i_{corr}[k]$, $q_{corr}[k]$ with the original Cartesian data sample as shown in FIG. 3A to create the compensated Cartesian data sample $i_x[k]$, $q_x[k]$.

Figure 4:
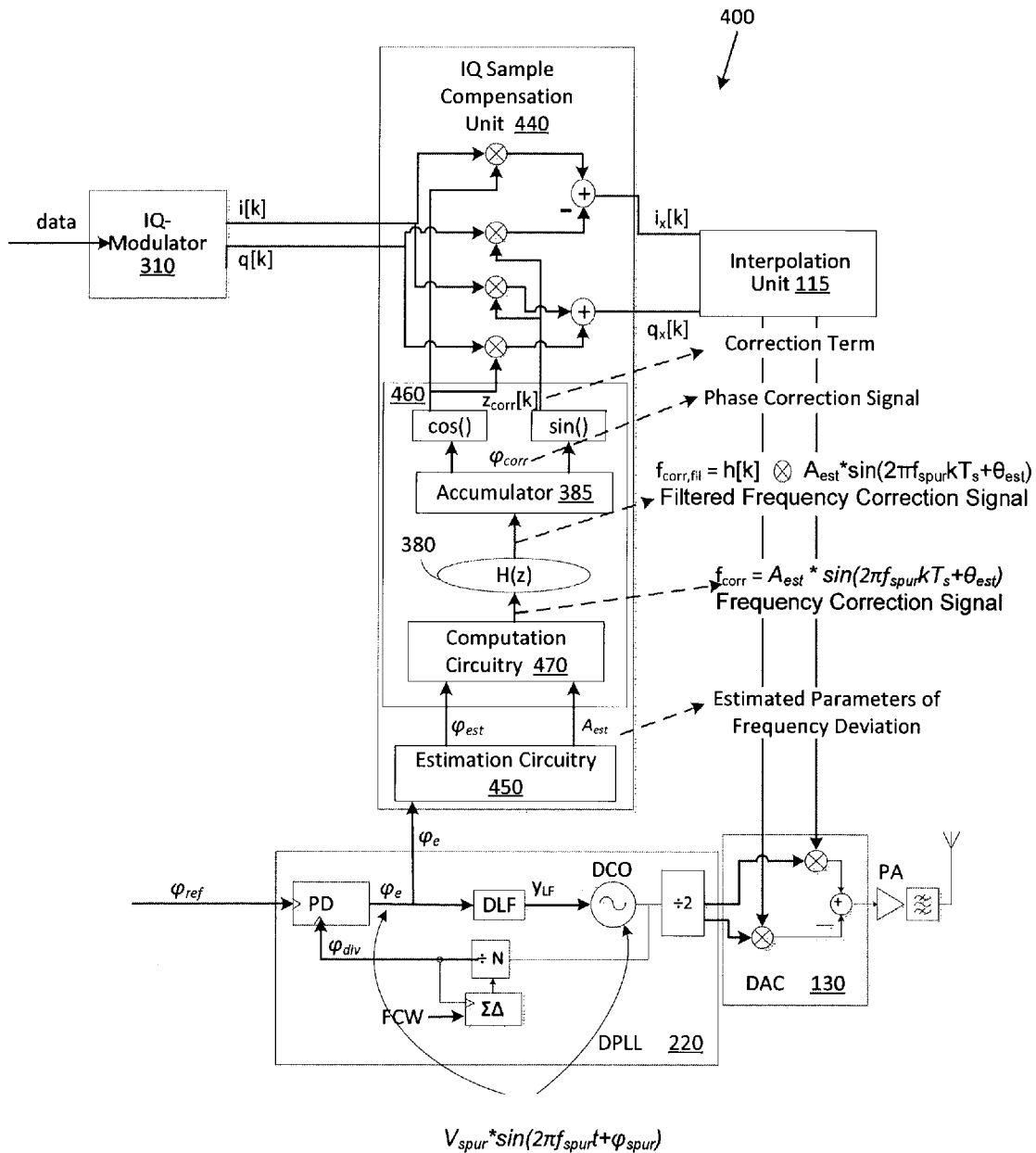
FIG. 4 illustrates an example Cartesian transmitter architecture in which a carrier wave generated by a local oscillator is modulated by IQ data samples that have been adjusted to compensate for a pulling effect on the local oscillator, according to one embodiment of the disclosure.

While the embodiments just described with respect to FIG. 3A are adapted to compensate the data sample for a second order harmonic interference induced by the pulling effect, other forms of interference signals including higher order harmonics could also be compensated for. FIG. 4 illustrates a block diagram of a Cartesian transmitter architecture 400 that includes an IQ data sample compensation unit 440 configured to directly adjust Cartesian data samples to compensate for a spurious tone. The IQ data sample compensation unit 440 includes estimation circuitry 450 and correction circuitry 460. The spurious tone could be either a baseband signal, e.g., induced by a supply voltage ripple with the voltage $v_{spur}$ at a frequency $f_{spur}$ that would be up-converted by the oscillator and generate sidebands $f_{DCO} \pm f_{spur}$. In other cases the injection could be caused by a high frequency clock signal that contains frequency components (either fundamental or harmonics) in the vicinity of the oscillator frequency $f_{DCO}$, i.e., at $f_{DCO} \pm f_{spur}$.

The instantaneous local oscillator output frequency that suffers from undesired modulation by a spurious tone can be expressed as:

$$f_{DCO}(t) = f_0 + K_{DCO} \gamma_{LF} - A_{spur} \cdot \sin(2\pi f_{spur} t + \theta_{spur}) \quad \text{Eq. (22)}$$

where:

$$A_{spur} \cdot \sin(2\pi f_{spur} t + \theta_{spur}) \quad \text{Eq. (23)}$$

represents the undesired frequency pulling term in which $A_{spur}$ is the unknown frequency interference magnitude or gain and $\theta_{spur}$ is the phase. In one example, $A_{spur} = V_{spur} \cdot K_{DCO,spur}$, where $V_{spur}$ is the magnitude of the spur and $K_{DCO,spur}$ is the oscillator gain with respect to the injection signal. Both, $V_{spur}$ and $K_{DCO,spur}$ are unknown and can be merged in a single unknown $A_{spur}$.

The estimation circuitry 450 provides estimates for $A_{spur}$ and $\theta_{spur}$ which are denoted as $A_{est}$ and $\theta_{est}$. These coefficients may be estimated through a Least-Squares (LS) or Least-Mean-Squares (LMS) based on a similar cost function such as the one described in G. Li Puma; R. Avivi; C. Carbonne, "Adaptive Techniques to Mitigate Oscillator Pulling in Radio Transmitter's," in IEEE Transactions on Circuits and Systems II: Express Briefs, vol. no. 99. In another example, the estimation unit is similar as the one derived above except that the reference data, namely the envelope signal A and the modulating phase θ, which were previously generated from the transmit data, are not needed in this case. In this case, the reference data is based on the Equation 23.

Considering the transfer function h(t) discussed above with reference to FIG. 3, which is experienced by the pulling frequency interference signal, the frequency deviation of the DPLL 220 due to the pulling effect can be expressed as:

$$f_p(t) = h(t) \otimes A_{spur} \cdot \sin(2\pi f_{spur} t + \theta_{spur}) \quad \text{Eq. (24)}$$

The frequency correction signal is composed by computation circuitry 470 according to:

$$f_{corr}[k] = A_{est} \sin(2\pi f_{spur} k T_s + \theta_{est}) \quad \text{Eq. (25)}$$

The accumulator component 385 performs the filtering operation to generate the filtered frequency correction signal:

$$f_{corr,fil}[k] = h[k] \otimes A_{est} \sin(2\pi f_{spur} T_s + \kappa_{est}) \quad \text{Eq. (26)}$$

If the gain and phase are estimated accurately enough, i.e., $A_{est} = A_{spur}$ and $\theta_{est} = \theta_{spur}$, the filtered frequency correction signal matches the frequency deviation caused by the interference signal given by equation 24.

Since the phase is the time integral of the frequency, the phase correction signal is obtained as $\phi_{corr} = 2\pi \int f(t) dt$. In a discrete-time implementation the integral is replaced by a cumulative sum, i.e. $\phi_{corr} = 2\pi T_s \sum_k f_{corr,fil}[k]$ which is realized in a practical application through the accumulator component 385. The output of the accumulator component is the complex correction term $z_{corr}[k]$, which is converted into IQ data sample correction term $i_{corr}[k] + q_{corr}[k]$ that is combined with the data sample as described with respect to FIG. 3.

The technique described with reference to FIG. 4 can be extended to compensate for the injection of multiple tones. In this case the estimation circuit generates the gain and phase estimates of the multi-tones and likewise, the computation unit generates the frequency correction signal which is composed of the multi-tones. The technique described with reference to FIG. 4 can be extended to compensate for of spurious tones that are injected at arbitrary points of the DPLL, e.g. the output or input of the phase-detector (PD) block, which is typically realized by a time-to-digital converters. (TDC). It is also applicable to self-generated spurious tones inside the DPLL, which occur for instance at near-integer N channels, where N is the division ratio between the DPLL output frequency and reference frequency $f_{ref}$. Likewise, it is applicable to mitigate spurs generated through non-linearities in the TDC or DCO. As derived in the preceding section, the transfer function H(z) 380 denotes the transfer function from the injection point of the interference to the output of the DPLL. As exemplified in FIG. 4, the injection point could be the output of the phase-detector block.

Figure 5:
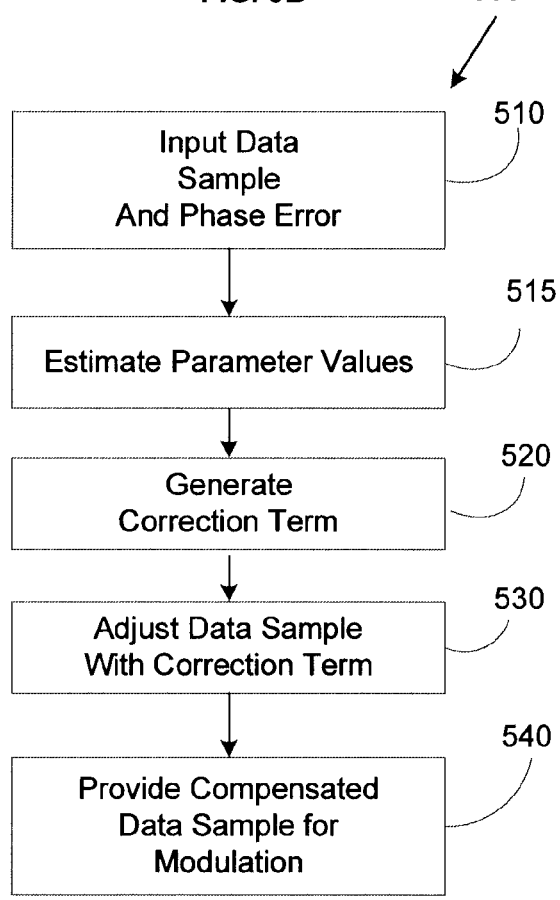
FIG. 5 illustrates a flowchart that outlines a method for compensating for a pulling effect on a local oscillator by adjusting data samples being modulated onto the carrier wave generated by the local oscillator, according to one embodiment of the disclosure.

FIG. 5 depicts a flowchart outlining one embodiment of a method 500 for adjusting a data sample to compensate for the pulling effect on the local oscillator or any other form of interference or distortion of the PLL's frequency that can be characterized prior to transmission of the data sample. The method 500 may be performed, for example, by the data sample compensation unit 240 of FIG. 2 or the IQ data sample compensation unit 340 of FIG. 3A or the IQ data sample compensation unit 440 of FIG. 4.

The method 500 includes, at 510, inputting a data sample to be communicated to a receiver and a phase error between a reference frequency and a carrier wave generated by the local oscillator. At 515, the method includes estimating values for parameters, based on the phase error, which describe a frequency deviation experienced by the PLL during transmission of the carrier wave modulated based on the data sample. At 520 a correction term is generated based at the estimated parameters. At 530 the method includes adjusting the data sample with the correction term to generate a compensated data sample. At 540 the compensated data sample is provided for modulation of a carrier wave generated by the local oscillator.

In one embodiment, the method includes computing a frequency correction signal based at least on the parameter values, such that the frequency correction signal comprises an estimate of the frequency deviation; filtering the frequency correction signal with a filter having a transfer function that models a loop response of the PLL to determine a filtered frequency correction signal; determining a phase correction signal based at least on the filtered frequency correction signal; converting the phase correction signal into the correction term; and incorporating the correction term with the data sample to generate the compensated data sample.

In one embodiment the method includes computing the frequency correction signal as a function of an amplitude of the data sample, a phase of the data sample, an estimated gain of a frequency deviation and an estimated phase offset of the frequency deviation. The method may also include filtering the frequency correction signal with a filter component selected to model a transfer function of the PLL from an injection point of the oscillator to an output of the PLL; and accumulating the filtered frequency correction signal to create the phase correction signal.

In one embodiment, the data samples comprise first I and Q components representing the data, and the method includes converting the phase correction signal into the correction term by converting the phase correction signal into second I and Q components such that the correction term comprises the second I and Q components.

In one embodiment, the method includes estimating a gain (γ) and phase offset (Γ) of the frequency deviation caused by a pulling effect on the local oscillator during transmission of the data sample. In another embodiment, the method includes estimating a gain (A) and phase offset (θ) of the frequency deviation caused by injection of spurious tones in one or more points in the PLL.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

EXAMPLES

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Example 1 is a transmitter adapted for compensating of undesired frequency deviation effects in a phased locked loop (PLL) coupled with a local oscillator and used in a mobile communication device. The transmitter includes: estimation circuitry configured to input a phase error between the local oscillator and a reference frequency and estimate, based on the phase error, values for parameters that describe a frequency deviation experienced by the PLL during transmission of a data sample; and correction circuitry configured to: generate a correction term based on the estimated parameters; adjust the data sample with the correction term to generate a compensated data sample; and provide the compensated data sample for modulation of a carrier wave generated by the local oscillator.

Example 2 includes the subject matter of example 1, including or omitting optional elements, wherein the estimation circuitry is configured to estimate a gain (γ) and phase offset (Γ) of the frequency deviation caused by a pulling effect on the local oscillator during transmission of the data sample.

Example 3 includes the subject matter of example 1, including or omitting optional elements, wherein the estimation circuitry is configured to estimate a gain (A) and phase offset (θ) of the frequency deviation caused by injection of spurious tones or self-generated spurious tones in one or more points in the PLL.

Example 4 includes the subject matter of examples 1, 2, and 3, including or omitting optional elements, wherein the correction circuitry is configured to: compute a frequency correction signal based at least on the parameter values such that the frequency correction signal comprises an estimate of the frequency deviation; filter the frequency correction signal with a filter having a transfer function that models a loop response of the PLL to determine a filtered frequency correction signal; determine a phase correction signal based at least on the filtered frequency correction signal; convert the phase correction signal into the correction term; and incorporate the correction term with the data sample to generate the compensated data sample.

Example 5 includes the subject matter of example 4, including or omitting optional elements, wherein the correction circuitry includes a computation unit configured to compute the frequency correction signal as a function of an amplitude of the data sample, a phase of the data sample, an estimated gain determined by the estimation circuitry, and an estimated phase offset determined by the estimation circuitry.

Example 6 includes the subject matter of example 4, including or omitting optional elements, wherein the correction circuitry includes: a filter component configured to filter the frequency correction signal, wherein the filter component is selected to model a transfer function of the PLL from an injection point to an output of the PLL; and an accumulator component configured to accumulate the filtered frequency correction signal to create the phase correction signal.

Example 7 includes the subject matter of example 4, including or omitting optional elements, wherein the data samples include first I and Q components representing the data, further wherein the correction circuitry is configured to convert the phase correction signal into the correction term by converting the phase correction signal into second I and Q components such that the correction term comprises the second I and Q components.

Example 8 is a transmitter, including: front end circuitry comprising: a phase locked loop (PLL) including an oscillator configured to generate a carrier wave and a mixer configured to: input a compensated data sample and modulate the carrier wave based on the compensated data sample. The transmitter includes baseband circuitry configured to generate a data sample to be communicated in a signal transmitted by the front end, wherein the baseband circuitry includes a data sample compensation unit configured to generate the compensated data sample by adjusting the data sample based on a frequency deviation of the PLL that occurs during transmission of the data sample by the front end circuitry.

Example 9 includes the subject matter of example 8, including or omitting optional elements, wherein an input to the oscillator is not adjusted to compensate for the frequency deviation.

Example 10 includes the subject matter of examples 8 and 9, including or omitting optional elements, wherein the baseband circuitry includes: estimation circuitry configured to estimate, based at least on a phase error between a local oscillator and a reference frequency, values of parameters describing the frequency deviation; and correction circuitry configured to: generate a correction term based at least on the estimated parameters; adjust the data sample with the correction term to generate a compensated data sample; and provide the compensated data sample to the mixer for modulation of the carrier wave.

Example 11 includes the subject matter of example 10, including or omitting optional elements, wherein the correction circuitry is configured to: compute a frequency correction signal based at least on the parameter values such that the frequency correction signal comprises an estimate of the frequency deviation; filter the frequency correction signal with a filter having a transfer function that models a loop response of the PLL to determine a filtered frequency correction signal; determine a phase correction signal based at least on the filtered frequency correction signal; convert the phase correction signal into the correction term; and incorporate the correction term with the data sample to generate the compensated data sample.

Example 12 includes the subject matter of example 12, including or omitting optional elements, wherein the correction circuitry includes a computation unit configured to compute the frequency correction signal as a function of an amplitude of the data sample, a phase of the data sample, an estimated gain determined by the estimation circuitry, and an estimated phase offset determined by the estimation circuitry.

Example 13 includes the subject matter of example 12, including or omitting optional elements, wherein the correction circuitry includes: a filter component configured to filter the frequency correction signal, wherein the filter component is selected to model a transfer function of the PLL from an injection point to an output of the PLL; and an accumulator component configured to accumulate the filtered frequency correction signal to create the phase correction signal.

Example 14 includes the subject matter of example 11, including or omitting optional elements, wherein the data samples include first I and Q components representing the data, further wherein the correction circuitry is configured to convert the phase correction signal into the correction term by converting the phase correction signal into second I and Q components such that the correction term comprises the second I and Q components.

Example 15 is a method for compensating of undesired frequency deviation effects in a phase locked loop (PLL) used in a mobile communication device, including inputting a data sample to be communicated; inputting a phase error between a reference frequency and a carrier wave generated by a local oscillator of a phase locked loop (PLL); estimating values for parameters, based on the phase error, which describe a frequency deviation experienced by the PLL during transmission of the carrier wave modulated based on the data sample; generating a correction term based on the estimated parameter values; adjusting the data sample with the correction term to generate a compensated data sample; and providing the compensated data sample for modulation of the carrier wave generated by the local oscillator.

Example 16 includes the subject matter of example 15, including or omitting optional elements, including computing a frequency correction signal based at least on the estimated parameter values, such that the frequency correction signal comprises an estimate of the frequency deviation; filtering the frequency correction signal with a filter having a transfer function that models a loop response of the PLL to determine a filtered frequency correction signal; determining a phase correction signal based at least on the filtered frequency correction signal; converting the phase correction signal into the correction term; and incorporating the correction term with the data sample to generate the compensated data sample.

Example 17 includes the subject matter of example 16, including or omitting optional elements, including computing the frequency correction signal as a function of an amplitude of the data sample, a phase of the data sample, an estimated gain of a frequency deviation and an estimated phase offset of the frequency deviation.

Example 18 includes the subject matter of example 16, including or omitting optional elements, including filtering the frequency correction signal with a filter component selected to model a transfer function of the PLL from an injection point to an output of the PLL; and accumulating the filtered frequency correction signal to create the phase correction signal.

Example 19 includes the subject matter of examples 16, 17, and 18, including or omitting optional elements, wherein the data samples comprise first I and Q components representing the data, further comprising converting the phase correction signal into the correction term by converting the phase correction signal into second I and Q components such that the correction term comprises the second I and Q components.

Example 19 includes the subject matter of examples 15, 16, 17, and 18, including or omitting optional elements, including estimating a gain ($\gamma$) and phase offset ($\Gamma$) of the frequency deviation caused by a pulling effect on the local oscillator during transmission of the data sample.

Example 20 includes the subject matter of examples 15, 16, 17, and 18, including or omitting optional elements, including estimating a gain (A) and phase offset ($\theta$) of the frequency deviation caused by injection of spurious tones or self-generated spurious tones in one or more points in the PLL.

Example 22 is an apparatus, including: means for inputting a data sample to be communicated; means for generating a correction term based at least on a frequency deviation of a frequency of a phase locked loop (PLL) that will occur during transmission of a carrier wave modulated based on the data sample, wherein the PLL generates the carrier wave and includes a local oscillator; means for adjusting the data sample with the correction term to generate a compensated data sample; and means for providing the compensated data sample for modulation of a carrier wave generated by the local oscillator.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. A transmitter adapted for compensating of undesired frequency deviation effects in a phase locked loop (PLL) coupled with a local oscillator and used in a mobile communication device, the transmitter comprising:
   estimation circuitry configured to:
      input a phase error between the local oscillator and a reference frequency; and
      estimate, based on the phase error, values for parameters that describe a frequency deviation experienced by the phase locked loop (PLL) during transmission of a data sample; and
   correction circuitry configured to:
      generate a correction term based on the estimated parameters;
      combine the correction term with the data sample to generate a compensated data sample; and
      provide the compensated data sample for modulation of a carrier wave generated by the local oscillator.

2. The transmitter of claim 1, wherein the estimation circuitry is configured to estimate a gain (γ) and phase offset (Γ) of the frequency deviation caused by a pulling effect on the local oscillator during transmission of the data sample.

3. The transmitter of claim 1, wherein the estimation circuitry is configured to estimate a gain (A) and phase offset (θ) of the frequency deviation caused by injection of spurious tones or self-generated spurious tones in one or more points in the PLL.

4. The transmitter of claim 1, wherein the correction circuitry is configured to:
   compute a frequency correction signal based at least on the parameter values such that the frequency correction signal comprises an estimate of the frequency deviation;
   filter the frequency correction signal with a filter having a transfer function that models a loop response of the PLL to determine a filtered frequency correction signal;
   determine a phase correction signal based at least on the filtered frequency correction signal; and
   convert the phase correction signal into the correction term.

5. The transmitter of claim 4, wherein the correction circuitry comprises a computation unit configured to compute the frequency correction signal as a function of an amplitude of the data sample, a phase of the data sample, an estimated gain determined by the estimation circuitry, and an estimated phase offset determined by the estimation circuitry.

6. The transmitter of claim 4, wherein the correction circuitry comprises:
   a filter component configured to filter the frequency correction signal, wherein the filter component is selected to model a transfer function of the PLL from an injection point to an output of the PLL; and
   an accumulator component configured to accumulate the filtered frequency correction signal to create the phase correction signal.

7. The transmitter of claim 4, wherein the data samples comprise first I and Q components representing the data, further wherein the correction circuitry is configured to convert the phase correction signal into the correction term by converting the phase correction signal into second I and Q components such that the correction term comprises the second I and Q components.

8. A method for compensating of undesired frequency deviation effects in a phase locked loop (PLL) used in a mobile communication device, the method comprising:
   inputting a data sample to be communicated;
   inputting a phase error between a reference frequency and a carrier wave generated by a local oscillator of a phase locked loop (PLL);
   estimating values for parameters, based on the phase error, which describe a frequency deviation experienced by the PLL during transmission of the carrier wave modulated based on the data sample;
   generating a correction term based on the estimated parameter values;
   combining the correction term with the data sample to generate a compensated data sample; and
   providing the compensated data sample for modulation of the carrier wave generated by the local oscillator.

9. The method of claim 8, comprising:
   computing a frequency correction signal based at least on the estimated parameter values, such that the frequency correction signal comprises an estimate of the frequency deviation;
   filtering the frequency correction signal with a filter having a transfer function that models a loop response of the PLL to determine a filtered frequency correction signal;
   determining a phase correction signal based at least on the filtered frequency correction signal; and
   converting the phase correction signal into the correction term.

10. The method of claim 9, comprising computing the frequency correction signal as a function of an amplitude of the data sample, a phase of the data sample, an estimated gain of a frequency deviation and an estimated phase offset of the frequency deviation.

11. The method of claim 9, comprising:
   filtering the frequency correction signal with a filter component selected to model a transfer function of the PLL from an injection point to an output of the PLL; and
   accumulating the filtered frequency correction signal to create the phase correction signal.

12. The method of claim 9, wherein the data samples comprise first I and Q components representing the data, further comprising converting the phase correction signal into the correction term by converting the phase correction signal into second I and Q components such that the correction term comprises the second I and Q components.

13. The method of claim 8, comprising estimating a gain ($\gamma$) and phase offset ($\Gamma$) of the frequency deviation caused by a pulling effect on the local oscillator during transmission of the data sample.

14. The method of claim 8, comprising estimating a gain (A) and phase offset ($\theta$) of the frequency deviation caused by injection of spurious tones or self-generated spurious tones in one or more points in the PLL.

* * * * *